United States Patent [19]
Lewis et al.

[11] 3,936,765
[45] Feb. 3, 1976

[54] SURFACE ACOUSTIC WAVE OSCILLATORS

[75] Inventors: Lewis; James Dennis Maines, both of Malvern, England

[73] Assignee: National Research Development Corporation, London, England

[22] Filed: June 4, 1974

[21] Appl. No.: 476,275

[30] Foreign Application Priority Data
June 6, 1973   United Kingdom.................... 27095
May 3, 1974    United Kingdom.................... 19653

[52] U.S. Cl................. 331/1 R; 331/25; 331/107 A; 331/135; 331/155
[51] Int. Cl.²....................... H03B 3/04; H03B 5/30
[58] Field of Search........... 331/107 A, 25.1 R, 135, 331/155

[56] References Cited
UNITED STATES PATENTS
3,582,540   6/1971   Adler et al.................. 331/107 A X

*Primary Examiner*—Siegfried H. Grimm
*Attorney, Agent, or Firm*—Cushman, Darby & Cushman

[57] ABSTRACT

A surface acoustic wave oscillator comprises a surface acoustic wave delay line and amplifier. The phase difference between signals received from two transducers on the surface acoustic wave delay line is measured by a phase sensitive detector whose output is used to control a phase correction circuit. The oscillator may oscillate at a steady frequency or be frequency modulated.

11 Claims, 6 Drawing Figures

SURFACE ACOUSTIC WAVE OSCILLATORS

This invention relates to surface acoustic wave (SAW) oscillators.

Such oscillators include a SAW delay line having an input and at least one output transducer mounted on e.g. a piezoelectric substrate, and an amplifying circuit connected to the two transducers. When electrical energy is supplied to the amplifier, noise in the amplifier is fed into the input transducer and hence into the substrate as surface acoustic waves of various frequencies. However, the physical configuration of the transducers and length between transducers, suppresses all frequencies except allowed modes of frequencies or, preferably, all frequencies except a centre frequency $f_o$. Thus the delay line applies a positive feed-back of signals at frequency $f_o$ into the amplifier to maintain oscillation within the amplifier at frequency $f_o$. Oscillators may be designed to suppress strongly all modes of oscillation except the desired centre frequency $f_o$; one such oscillator is described in U.S. Patent application Ser. No. 442,624, filed on Feb. 14, 1974 by Meirion Francis Lewis and entitled "Accoustic Wave Devices," and in Electronics Letters Vol 9 No 10 May 17, 1973 page 195. SAW delay lines have inherent temperature stability but the amplifying circuit has temperature dependent phase shift.

An object of this invention is to eliminate the effect of any temperature dependent phase shift through the amplifying circuit, so that the frequency of oscillation is determined by the delay line alone. It is an object of an embodiment of this invention to provide a frequency modulated SAW oscillator.

According to this invention a surface acoustic wave oscillator comprises a surface acoustic wave delay line having an input transducer and an output transducer mounted on a substrate capable of supporting acoustic waves, an amplifier circuit connected to the input and output transducer, a phase sensitive detector for measuring the phase difference between signals received from two transducers mounted on the substrate and giving an output dependent on said phase difference, and means controlled by phase sensitive detector for applying to the amplifier circuit a correcting signal to maintain a desired phase difference measured by the phase sensitive detector.

The phase sensitive detector may monitor and maintain the phase difference between any two transducers in the acoustic circuit, not necessarily the main input and output transducers.

The means for applying a correcting signal may include a variable phase shift network connected to the phase sensitive detector for applying a correcting phase shift to the amplifier circuit. Alternatively the means may include a second output transducer on the SAW delay line and a variable impedance for supplying a variable amplitude out of phase input to the amplifier circuit. Typically the latter input will be 90° out of phase with the main input.

In an embodiment of the invention the output from the phase sensitive detector may have applied thereto a signal Vm which produces a frequency modulation of the oscillator. This may be achieved by connecting the output of the phase sensitive detector into one of two inputs to a differential amplifier, applying the signal Vm to the other input to the differential amplifier, and connecting the output of the differential amplifier to the means for applying to the amplifying circuit a correcting signal. The phase sensitive detector is arranged to give a linear output over its operating range.

The substrate is preferably piezo electric, eg quartz or lithium niobite; alternatively it may be one capable of supporting surface acoustic waves with piezo electric material deposited under/or over the transducers.

The invention will now be described by way of example only in the accompanying drawings in which.

Figure 1:
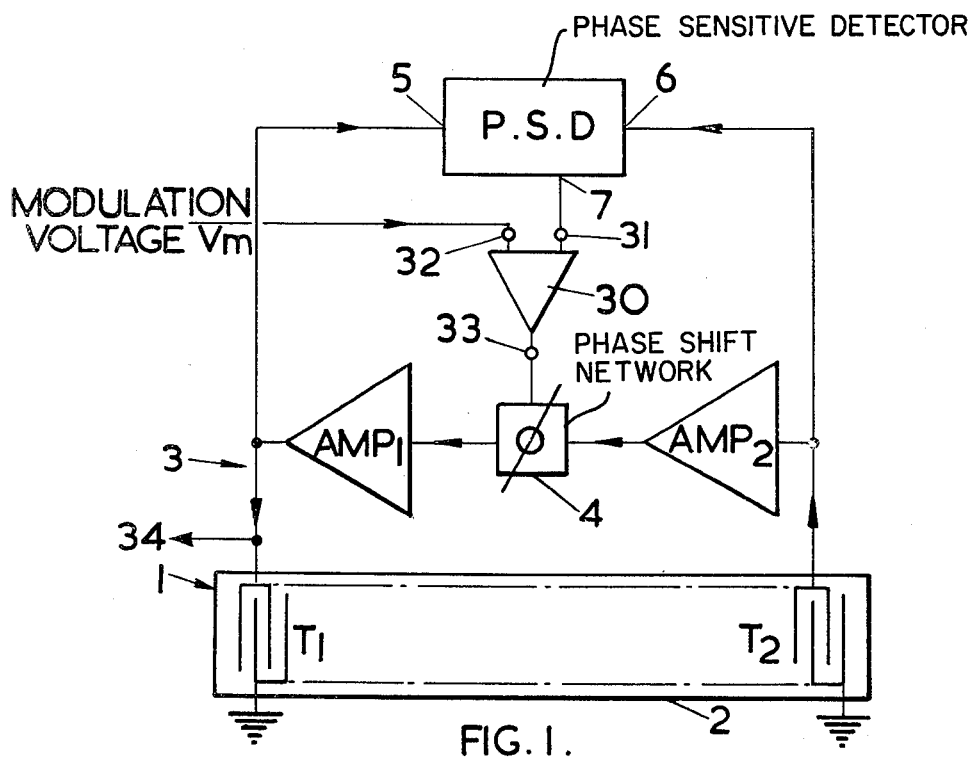
FIG. 1 is a block diagram of one form of the invention

FIG. 1 shows a SAW delay line 1 comprising a quartz substrate 2 with an input transducer $T_1$ and an output transducer $T_2$ both shown diagrammatically as a single finger pair transducer although typically $T_1$ may have 100 finger pairs and $T_2$ 60 finger pairs. The length of $T_1$ may be equal to the distance between centres of $T_1$ and $T_2$ to provide mode selection as described in U.S. Pat. application Ser. No. 442,624. An amplifying circuit 3 comprising amplifier $Amp_1$, $Amp_2$ connected to the transducers $T_1$, $T_2$ provides sufficient gain to overcome attenuation in the SAW delay line 1 and maintain oscillations within the amplifier circuit 3. A variable phase shift network 4 is connected between $Amp_1$ and $Amp_2$. A phase sensitive detector PSD has its two inputs 5, 6 (normally called 'reference' and 'signal' inputs) connected to the transducers $T_1$, $T_2$ and has its output 7 connected to one, the first, input 31 of a differential amplifier 30. Frequency modulated signals may be applied to the other, a second 32, input to the differential amplifier 30. The output 33 from the differential amplifier 30 is connected to the variable phase shift network. Output from the oscillator, for feeding into conventional circuits eg radio receivers, is shown at 34.

For some applications the differential amplifier 30 is not required and the output 7 of the phase sensitive detector is connected direct to the variable phase shift network 4. Alternatively the second input 32 to the differential amplifier 30 may be grounded.

The two amplifiers $Amp_1$ and $Amp_2$ may be replaced by a single amplifier.

In operation with zero signal applied to the second input 32 of the differential amplifier 30 (ie input 32 grounded) the oscillator comprising the SAW delay line 1 and the amplifying circuit 3 oscillates at a frequency predominantly determined by the parameters of the SAW delay line 1. The temperature of the amplifiers $Amp_1$, $Amp_2$ may change in operation and this and/or changes in the voltage applied to the amplifiers may cause a change in the phase shift between points 5 and 6. This phase shift change is monitored by the phase sensitive detector which gives an output signal dependent on the phase difference change and this signal is fed into the variable phase shift network 4 to apply a correcting phase shift into the amplifying circuit to maintain a constant phase shift between the signals appearing at transducers $T_1$, $T_2$. In practice a correction signal may be applied to the phase shift network at all times i.e., on switching on and thereafter.

The time constant of the phase shift detector may be long, e.g. about one second, to provide compensation for a slow temperature dependent phase shift change in the amplifiers whilst being unaffected by fast frequency modulated signals applied to the oscillator by circuitry (not shown).

For use as a frequency modulated oscillator two distinct modes of operation can be envisaged. The first mode obtains when the output, 7, from the phase sensitive detector PSD has a large time constant, $\tau$, say 1 sec. as mentioned above. If the modulation voltage, $V_m$, involves frequencies, $f_m$, much greater than the inverse of $\tau$, i.e., $f_m >> 1$Hz in the example where $\tau = 1$ sec. For example, $V_m$ may comprise an audio signal covering the band from 100 Hz to 5kHz. In these circumstances the output voltage 7 from the phase sensitive detector PSD cannot follow the rapid changes of the voltage $V_m$, and only corrects for any slow (> 1 sec) changes in the average frequency of the oscillator. The output 34 from the oscillator therefore comprises a corrected centre frequency, $f_o$, with frequency modulation at a rate $f_m$ and with a linearity determined by the linearity of the phase shift through the network 4 with applied voltage. This applied voltage is essentially the modulation voltage $V_m$ multiplied by the gain of the amplifier 30.

Figure 6:
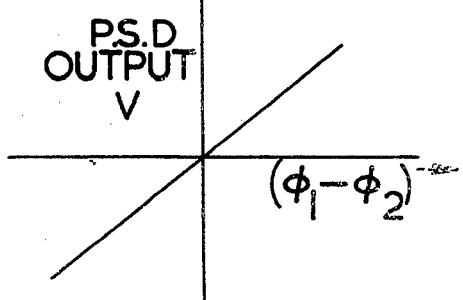
FIG. 6 shows a typical output from a phase sensitive detector.

The second mode of operation obtains when the time constant $\tau$ of the phase sensitive detector PSD is short compared with the inverse of modulation frequencies, $f_m$. For example when $f_m$ covers the aforementioned audio band and $\tau = 1$ microsecond. In this case the voltage, 7, out of the phase sensitive detector PSD has time 'to follow' the modulation voltage, $V_m$. To envisage this mode of operation it is useful to recall how the correction circuit 4 operates with no input voltage, $V_m$, i.e., with input 32 to amplifier 30 grounded. In this circumstance the oscillator is stabilised at frequency $f_o$ and the output 33 from amplifier 30 is G times the (small) voltage 31 where G is the large voltage gain of the amplifier 30. The sign of the feedback from the phase sensitive detector PSD is such as to reduce the voltage at 31 towards zero although it never quite equals zero because a small error signal is always necessary to operate the oscillator. This small error can be made negligible by increasing the gain, G, of the differential amplifier 30. When a modulating voltage is applied to 32, the output 33 is proportional to the difference in voltage between 31 and 32. Again because the gain G is large and the feedback in the correct sense, the stable state is one where a very small difference between 31 and 32 obtains. That is to say, the voltage at 31 follows that at 32, just as the voltage at 31 tended towards zero when 32 was grounded. The higher the amplifier gain G, the more closely does 31 follow 32. Now the output 7 is substantially proportional to the frequency deviation from $f_o$ (at least for small deviations) so that in operation this frequency deviation from $f_o$ is proportional to the input voltage to 32. Thus the oscillator is a frequency modulated oscillator with essentially linear frequency modulation, the linearity being determined by the linearity of the PSD, shown by FIG. 6.

In an alternative form of FIG. 1 (not shown) the variable phase shift network 4 is connected between transducer $T_2$ and the junction between the amplifier Amp$_2$ and the phase sensitive detector. The phase sensitive detector then corrects for any temperature variation in the delay line, and the frequency of oscillation is dependent on the amplifier characteristics.

Figure 2:
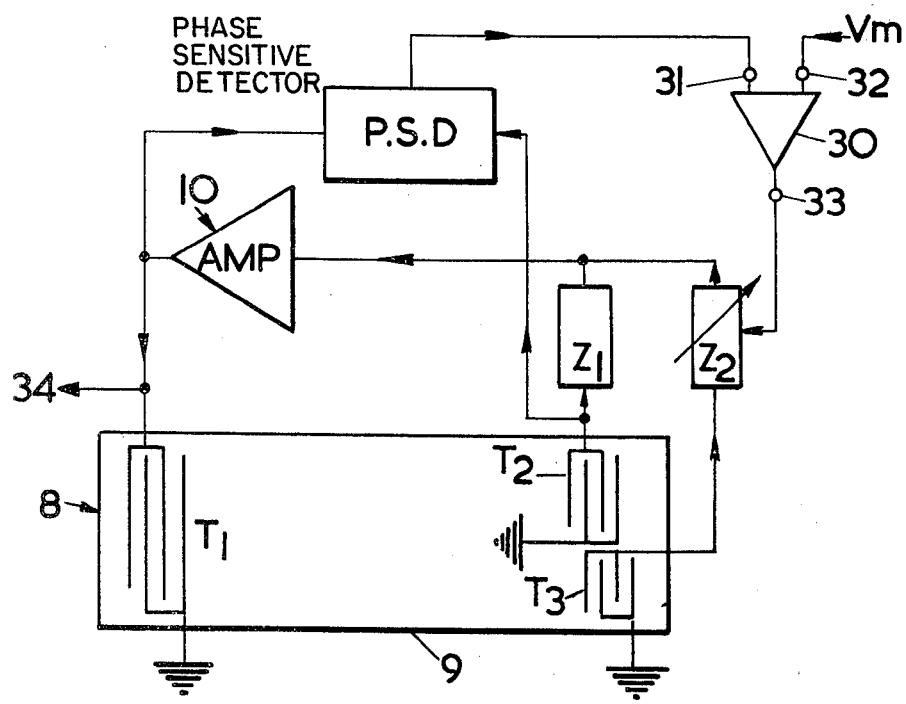
FIG. 2 is a block diagram of another form of the invention

FIG. 2 shows an alternative form of the invention comprising a SAW delay line 8 having a quartz substrate 9, input transducer $T_1$, and two output transducers $T_2$, $T_3$ spaced so that $T_3$ is further away from $T_1$ than $T_2$ is away from $T_1$. This increases the delay time at $T_3$ so that signals received by $T_3$ are delayed from those received by $T_2$. The spacing between $T_1$ and $T_3$ may be a quarter wave length giving a 90° phase shift. Also the length of the finger pairs may be varied so than $T_2$ has longer or shorter fingers than $T_3$ hence the signal received by $T_2$ will be greater or smaller respectively than that received by $T_3$. Transducer $T_2$ is connected through a fixed impedance $Z_1$ to the input of an amplifier Amp which has its output connected to the input transducer $T_1$. The transducer $T_3$ is connected through a variable impedance $Z_2$ to the amplifier input. A phase sensitive detector PSD has its two inputs connected to transducers $T_1$ and $T_2$, and its output connected to a first input 31 of a differential amplifier 30. A second input 32 may have applied thereto frequency modulated signals $V_m$. The output 33 from the differential amplifier is connected to the variable impedance $Z_2$.

In operation with $V_m = 0$ the oscillator comprising the SAW delay line 8 and amplifier circuit 10, oscillates at a frequency determined by the physical dimensions and separation of transducers $T_1$ and $T_2$. A change in operating temperature in the amplifier Amp will cause a phase change in the amplifier circuit 10 between transducers $T_1$ and $T_2$. This change will be sensed by the phase sensitive detector which applies a correcting signal to the variable impedance $Z_2$ thereby varying the signal applied to the amplifier by the transducer $T_3$. Operation when $V_m \neq 0$ is similar to that described with reference to FIG. 1 above.

Figure 3:
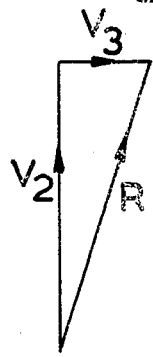
FIG. 3 is a vector diagram

FIG. 3 shows a vector diagram of the output of the SAW delay line of FIG. 2. As shown the output of $T_2$ is represented by $V_2$. The output of $T_3$ is delayed from the output of $T_2$ by a quarter wave length i.e., 90° and is thus represented by $V_3$. The resultant R is the sum of $V_2$ and $V_3$ and is varied, by varying the length of $V_3$, i.e., the output from $Z_2$, to maintain a constant phase between the input of transducer $T_1$ and the output of transducer $T_2$.

The variable impedance $Z_2$ may be a variable resistor e.g. a field effect transistor (FET), or an amplifier.

Figure 4:
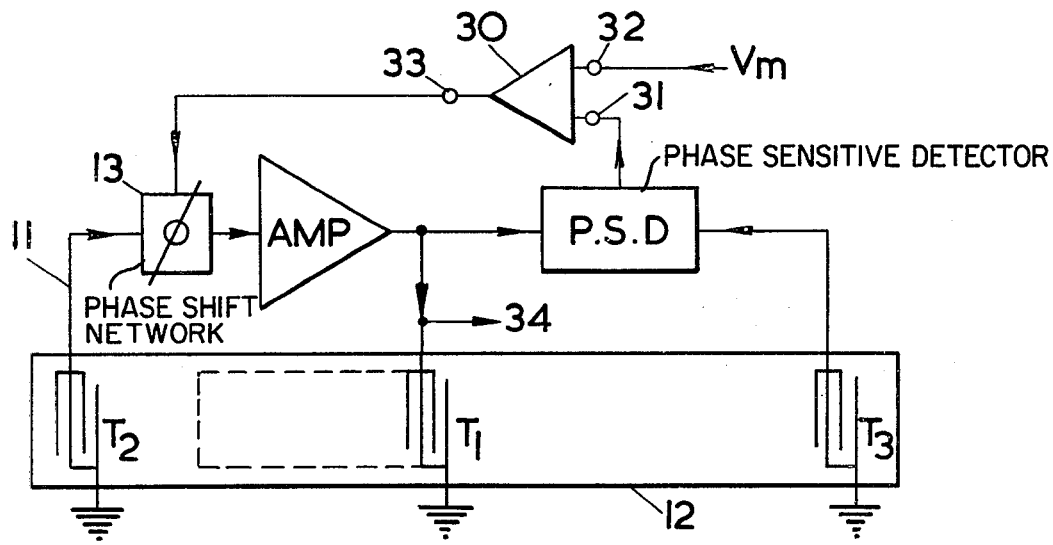
FIG. 4 is a block diagram of another form of the invention

FIG. 4 shows another form of the invention in which the oscillator 11 comprises input and output transducers, $T_1$, $T_2$ respectively mounted on a substrate 12. An amplifier and variable phase shift network 13 are connected in series between $T_1$ and $T_2$. A third transducer $T_3$ is mounted on the substrate 12 spaced from $T_1$ and in the path of acoustic waves transmitted from $T_1$. A phase sensitive detector PSD has its two inputs connected to transducers $T_1$, $T_3$ and its output connected to a first input 31 of a differential amplifier 30. Frequency modulated signals $V_m$ may be applied to a second input 32 of the differential amplifier 30 whose output 33 is connected to the variable phase shift network 13.

The SAW path length between transducer $T_1$ and $T_3$ may be much greater than between $T_1$ and $T_2$ to giving greater sensitivity of phase control. If $V_m = 0$ then the length between $T_1$ and $T_3$ can be made as large as possible. However, when modulated signal $V_m = 0$ are applied care must be taken to ensure that phase changes greater than $2\pi$ do not occur between $T_1$ and $T_3$, i.e., if $V_m$ is modulated over $\pi/2$ then length $T_1$ to $T_3$ can be up to four times the length $T_1$ to $T_2$. Similarly if $V_m$ is modulated over $\pi/4$ then the length $T_1$ to $T_3$ can be up to eight times the length $T_1$ to $T_2$.

In operation with $V_m = 0$ the oscillator 11 comprising transducers $T_1$, $T_2$ and the amplifier Amp oscillates at a frequency predominantly determined by the SAW delay line. Any phase change, caused e.g. by a temperature change in the amplifier will change the frequency of oscillation in the SAW delay line. The frequency of SAW between transducers $T_1$ and $T_2$ is the same as between $T_1$ and $T_3$ and so any change in frequency from the desired frequency in the oscillator circuit will show itself as a change in the phase shift between $T_1$ and $T_3$. This is detected by the phase sensitive detector which applies a correcting signal to the variable phase shift network. When $V_m \neq 0$ (and is modulated) the oscillator behaves as described with reference to FIG. 1.

Figure 5:
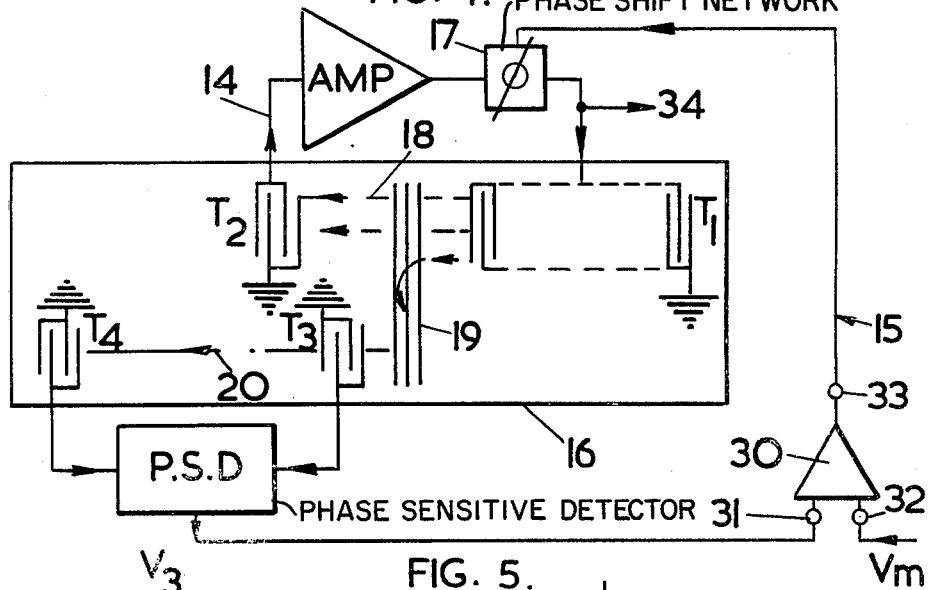
FIG. 5 is a block diagram of another form of the invention incorporating a multistrip coupler

FIG. 5 shows another form of SAW oscillator in which the oscillator 14 is electrically separate from the correcting circuit 15 to eliminate any affects of bulk acoustic waves in the substrate. As shown the oscillator 14 comprises an input and an output transducer $T_1$, $T_2$ respectively mounted on a substrate 16. An amplifier Amp and variable phase shift network 17 are connected in series to the transducers $T_1$, $T_2$. Across the acoustic path 18 between $T_1$, $T_2$ is a multistrip coupler 19 (as described in U.S. Pat. 3,836,876, granted on Sept. 14, 1974 to Frank Graham Marshall et al and entitled "Acoustic Surface Wave Devices") which couples some of the SAW into a second acoustic path 20. In this second acoustic path 20 are two monitoring transducers $T_3$, $T_4$ whose outputs are connected to the inputs of a phase sensitive detector PSD. The output of the phase sensitive detector is connected to the first input 31 of a differential amplifier 30. The second input 32 of the differential amplifier 30 may have applied thereto frequency modulated signals $V_m$. Output 33 from the differential amplifier is connected to the variable phase shift network 17.

In operation with $V_m = 0$ the transducers $T_3$, $T_4$ monitor the frequency of SAW in the oscillator circuit 14 and any change in the desired frequency causes a change in phase between $T_3$ and $T_4$. This is detected in the phase sensitive detector which applies a correcting signal to the variable phase shift network 17. When $V_m \neq 0$ (and is modulated) the oscillator behaves as described above with reference to FIG. 1.

The phase sensitive detector described in FIGS. 1, 2, 4 and 5 may be a double balanced mixer.

The variable phase shift circuit described in FIGS. 1, 4 and 5 may be a bridge circuit using three fixed impedances and a variable capacitor such as a VARACTOR. Alternatively the variable phase shift circuit may include a PIN diode with a variable DC bias applied thereto; the variable resistance of the PIN diode combining with a fixed capacitance e.g. that of the transducer $T_1$ to vary the phase. Alternatively the variable phase shift circuit may include a VARACTOR diode variably biased by DC signals applied thereto; the variable capacitance of the VARACTOR diode combining with a fixed resistance, e.g. that of the amplifier, to vary the phase.

In all the forms described above the acoustic waves travelling in the substrate have been surface waves. For some applications bulk waves may be used instead and the surface waves tuned or damped by absorbers on the surface of the substrate. One advantage of using certain bulk waves (e.g. in quartz lithium tantalate or other piezoelectrics with zero temperature coefficients of delay) is the improved temperature stability of the delay line itself which when combined with the circuitry described herein produces an exceptionally temperature-stable oscillator.

In all the devices described the sign of the correction signal must be chosen correctly to provide the required stable operation. If the wrong sign is used the error is amplified rather than reduced.

What I claim is:

1. An acoustic wave oscillator comprising a surface acoustic wave delay line having an input transducer and an output transducer mounted on a substrate capable of supporting acoustic waves, an amplifier circuit having its input connected to the output of the output transducer, and its output connected to the input of the input transducer a phase sensitive detector for measuring the phase difference between signals received from two transducers mounted on the substrate and giving an output dependent on said phase difference, and means controlled by the phase sensitive detector for applying to the amplifier circuit a correcting signal to maintain a desired phase difference measured by the phase sensitive detector.

2. An oscillator as claimed in claim 1 wherein the phase sensitive detector is connected to the input and output transducers.

3. An oscillator as claimed in claim 1 wherein the phase sensitive detector is connected to the input transducer and to a second output transducer arranged to receive surface acoustic waves from the input transducer.

4. An oscillator as claimed in claim 1 wherein the means for applying a correcting signal is a phase shift circuit.

5. An oscillator as claimed in claim 1 wherein the means for applying a correcting signal includes a second output transducer arranged on the substrate to receive surface acoustic waves from the input transducer out of phase relative to those received by the other output transducer, and a variable impedance connected between the second output transducer and the amplifier circuit input whereby under the control of the phase sensitive detector a variable amplitude out of phase signal is applied to the amplifier circuit.

6. An oscillator as claimed in claim 1 which further includes means for applying a signal to the oscillator to produce a frequency modulation thereof.

7. An oscillator as claimed in claim 6 wherein the signal applying means is a differential amplifier having a first input connected to the phase sensitive detector output, a second input to which the signals for producing frequency modulation may be applied, and an output connected to the means for applying a correcting signal to the amplifier circuit.

8. An oscillator as claimed in claim 1 wherein the phase sensitive detector is arranged to have a linear output over its operating range.

9. An oscillator as claimed in claim 6, wherein the time constant of the phase sensitive detector is much longer than the inverse of modulation frequencies.

10. An oscillator as claimed in claim 6 wherein the time constant of the phase sensitive detector is much shorter than the inverse of modulation frequencies.

11. An oscillator as claimed in claim 1 wherein the substrate is piezoelectric.

* * * * *